United States Patent [19]

Janisiewicz et al.

[11] Patent Number: 4,510,806
[45] Date of Patent: Apr. 16, 1985

[54] GAUGING METHOD AND APPARATUS FOR COMPONENTS HAVING LEADS

[75] Inventors: Stanley W. Janisiewicz, Endwell; Emery L. Rose, Chenango Bridge, both of N.Y.

[73] Assignee: Universal Instruments Corporation, Binghamton, N.Y.

[21] Appl. No.: 489,203

[22] Filed: Apr. 27, 1983

[51] Int. Cl.³ ............................................. G01R 31/26
[52] U.S. Cl. ............................... 73/432 R; 209/556; 209/573; 209/587; 324/73 AT
[58] Field of Search ................... 73/432 R, 432 V; 324/73 AT, 73 PC; 209/556, 573, 587

[56] References Cited

U.S. PATENT DOCUMENTS

| | | | |
|---|---|---|---|
| 2,887,622 | 5/1959 | Rayburn | 324/73 PC |
| 3,239,760 | 3/1966 | Schweitzer | 324/158 F |
| 3,816,746 | 6/1974 | Gugliotta | 209/587 |

FOREIGN PATENT DOCUMENTS 2637878  3/1978  Fed. Rep. of Germany ........ 324/73 AT Primary Examiner—S. Clement Swisher
Attorney, Agent, or Firm—Fidelman, Wolffe & Waldron

[57] ABSTRACT

Electrical components of various sizes and shapes are appropriately accommodated and positioned at a gauging station, at which lead straightening and testing of electrical functioning of each component is performed. An alternate embodiment provides for distinguishing between acceptable and unacceptable components by differentiating between component lead tips and a contrasting background, through use of an optical scanner.

33 Claims, 13 Drawing Figures

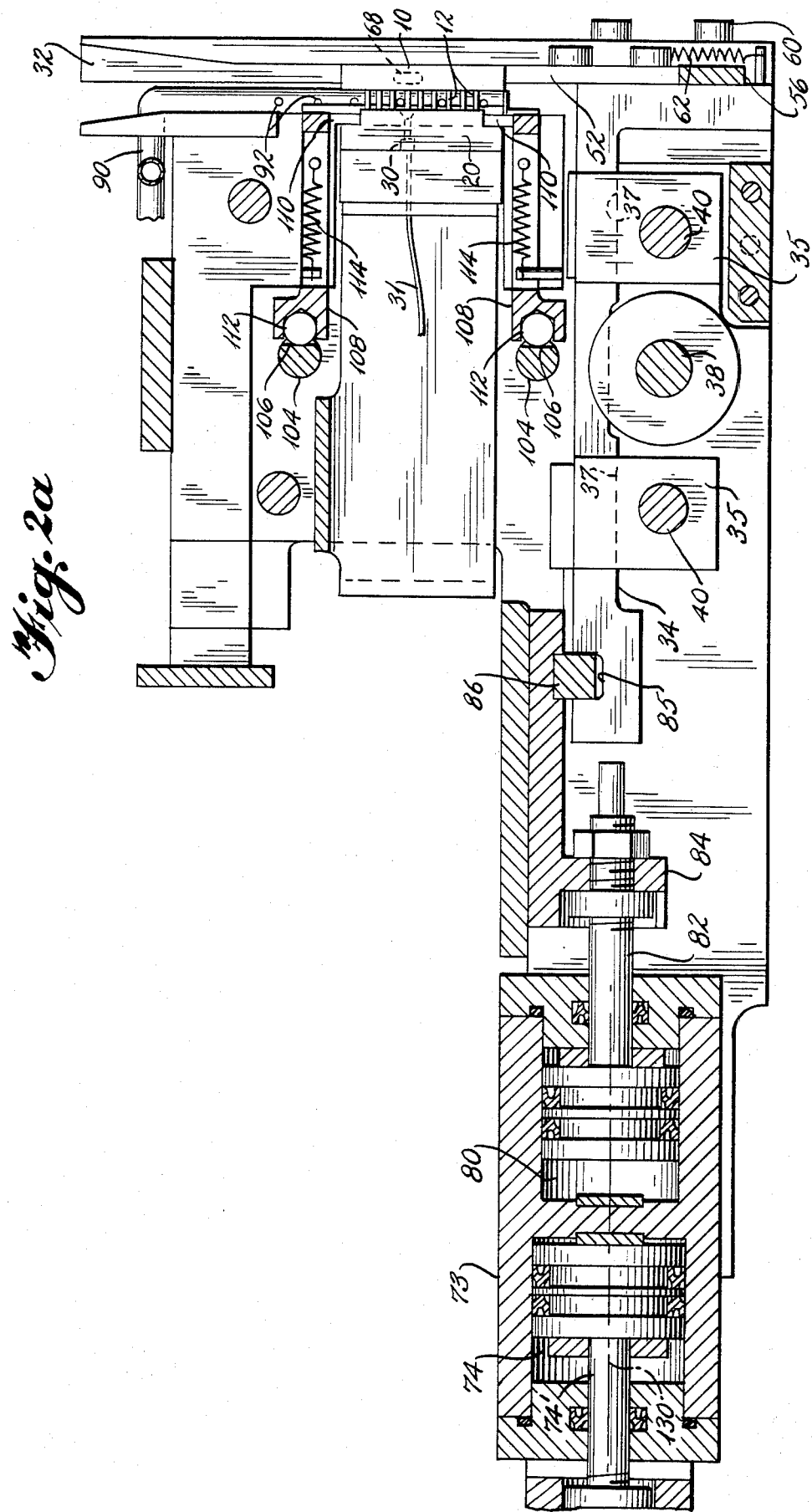

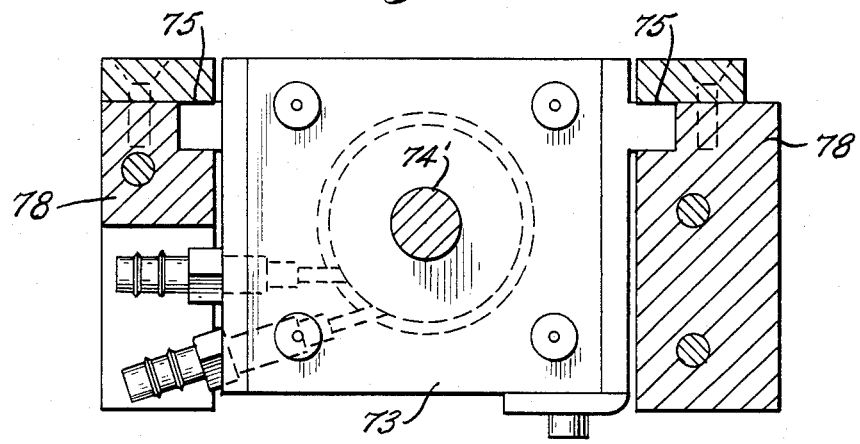
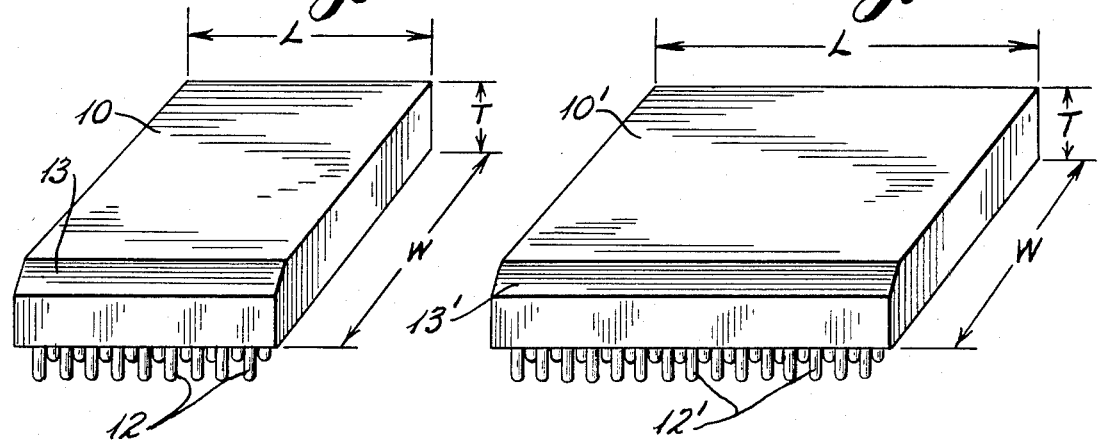
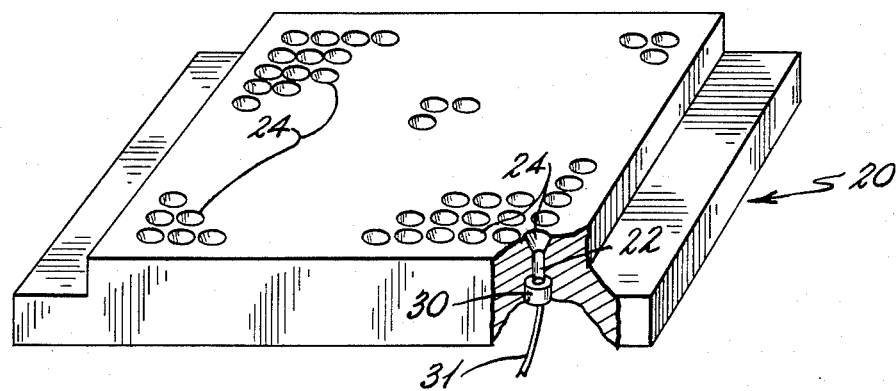

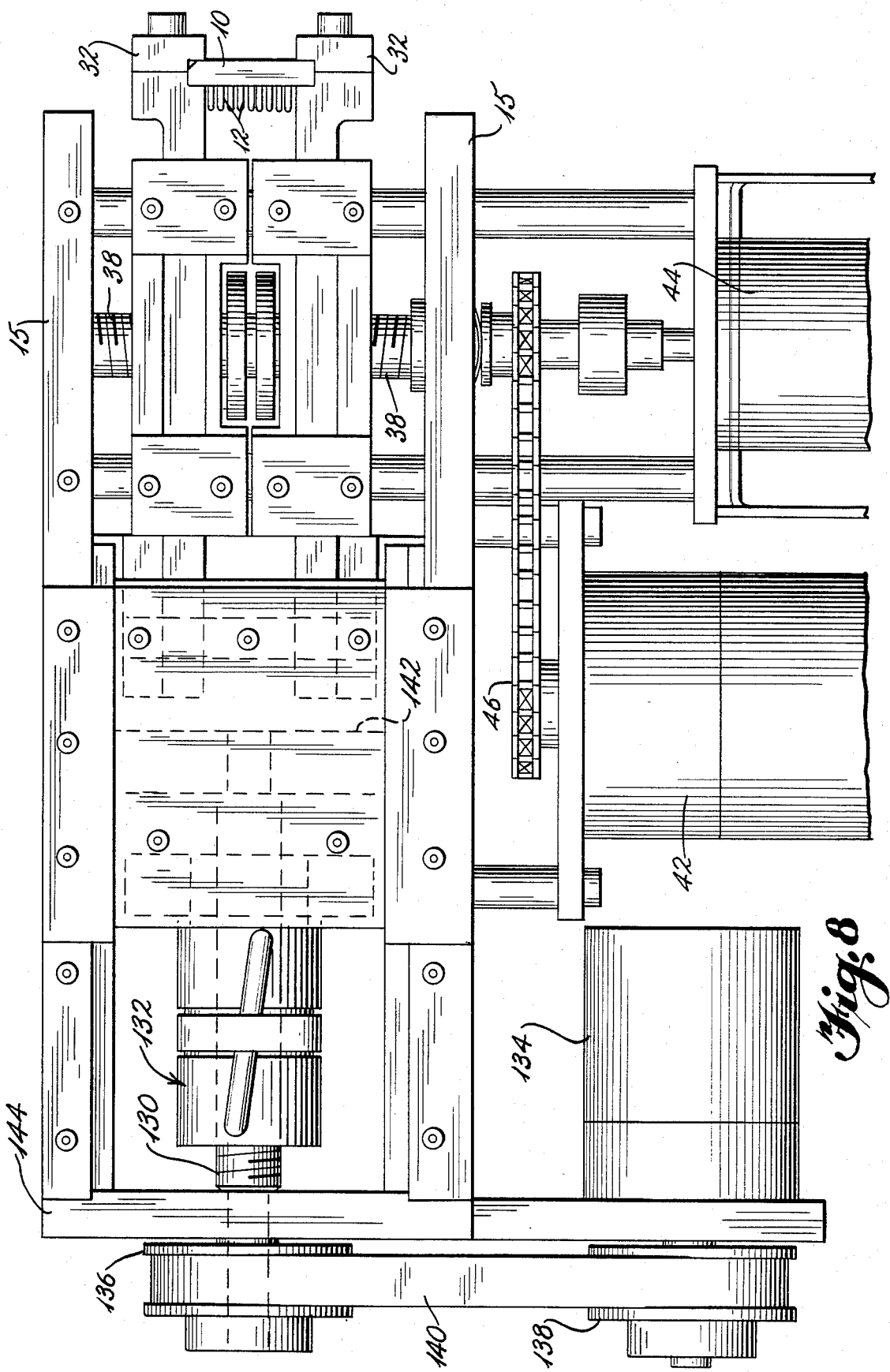

GAUGING METHOD AND APPARATUS FOR COMPONENTS HAVING LEADS

CROSS-REFERENCE TO THE PRIOR ART

U.S. Application Ser. No. 471,056—INDEXED FEED OF ELECTRONIC COMPONENT SUPPLY TUBES—Janisiewicz, et al., Filed Mar. 1, 1983.

BACKGROUND AND SUMMARY OF THE INVENTION

The invention is directed particularly to a method and apparatus for handling electronic components of the type commonly referred to as "square modules". However, the concept of the novel method and apparatus disclosed herein is certainly applicable to other types of electrical or non-electrical components having bodies and lead-like members protruding therefrom.

Since components of the so called "square module" type are generally new in the electrical field, prior art methods and apparatus for handling these types of devices are very limited. The above cross-referenced prior art discloses a method and apparatus by which "square modules" are conveniently handled just prior to reception by the apparatus of the instant invention. Typically, these modules could be transferred to the guide rails of the instant disclosure directly or by a transfer shuttle or the like. Further, although devices of this nature have bodies which are generally square, when viewed along their leads, it is contemplated that these bodies also could be generally rectangular or otherwise-shaped.

Accordingly, it is an object of the instant invention to provide a method and apparatus for handling components of the above-described nature, particularly for the purpose of straightening the leads of the components sufficiently for insertion into corresponding holes of a circuit board, as well as for testing the electrical functioning of the electrical component.

It is a further object of this invention, whether or not electrical functioning of a component is to be tested, to provide for detection of good and bad leads. Bad leads generally may be described as too short, missing, or bent beyond correction by the lead straightening function disclosed herein.

Additionally, it is an object of this invention to provide a method and apparatus for the automated handling of such components, for which the various dimensions of the leads and of the body are automatically compensated or adjusted according to a controller such as a programmable computer.

These and other objects of the invention will become apparent from the following disclosure.

In one embodiment of the invention, a pair of guide rails are variable in spacing and moveable toward and away from a lead straightening block, such that components having various dimensions may be gravity-fed along the guide rails to a gauging station. A vertical stop member is adjustable in conjunction with or separately from the guide rails in order to properly position the components at the gauging station according to the lengths of the bodies. Such adjustments or variations are made according to the dimensions of the component to be received by the guide rails.

Having been properly located at the gauging station, a component is gauged by driving the guide rails toward an oppositely disposed gauge block. The gauge block has generally conical-shaped lead-in guides and lead straightening holes which receive the leads as the component is moved toward the block. Behind the lead straightening holes, electrical contacts may be situated so that electrical functioning of the component may be dynamically investigated. Further, the back portion of the lead straightening block may be treated, as by a matte black paint, such that tips of the leads protruding through the back of the block may be distinguished therefrom by illumination and scanning.

Having made the appropriate test of the device, whether for proper lead lengths or configurations or for electrical functioning of the components, the body of the component is then gripped by an insertion head or the like for removal of the component from the gauge block and subsequent handling. In order to remove the component from the gauge block, the guide rails are moved to an unobstructing position and, during retraction of the insertion head, stripper fingers engage the opposite side of the component body to disengage the leads from the lead straightening holes.

BRIEF DESCRIPTION OF THE DRAWINGS

FIG. 2A is a cross-section, as generally viewed in the direction of arrows 2A—2A of FIG. 1.

FIG. 5 is a partial rear elevation of the device of FIG. 1.

FIG. 8 is a top plan view illustrating still another embodiment of the invention.

FIG. 9 is an isometric view of the lead straightener portion of a gauge block, with a portion broken away to illustrate a conical-shaped lead-in and an electrical contact.

FIGS. 10 and 11 are isometric views of typical components handled by the apparatus of the instant invention.

DETAILED DESCRIPTION OF THE INVENTION

Figure 1:
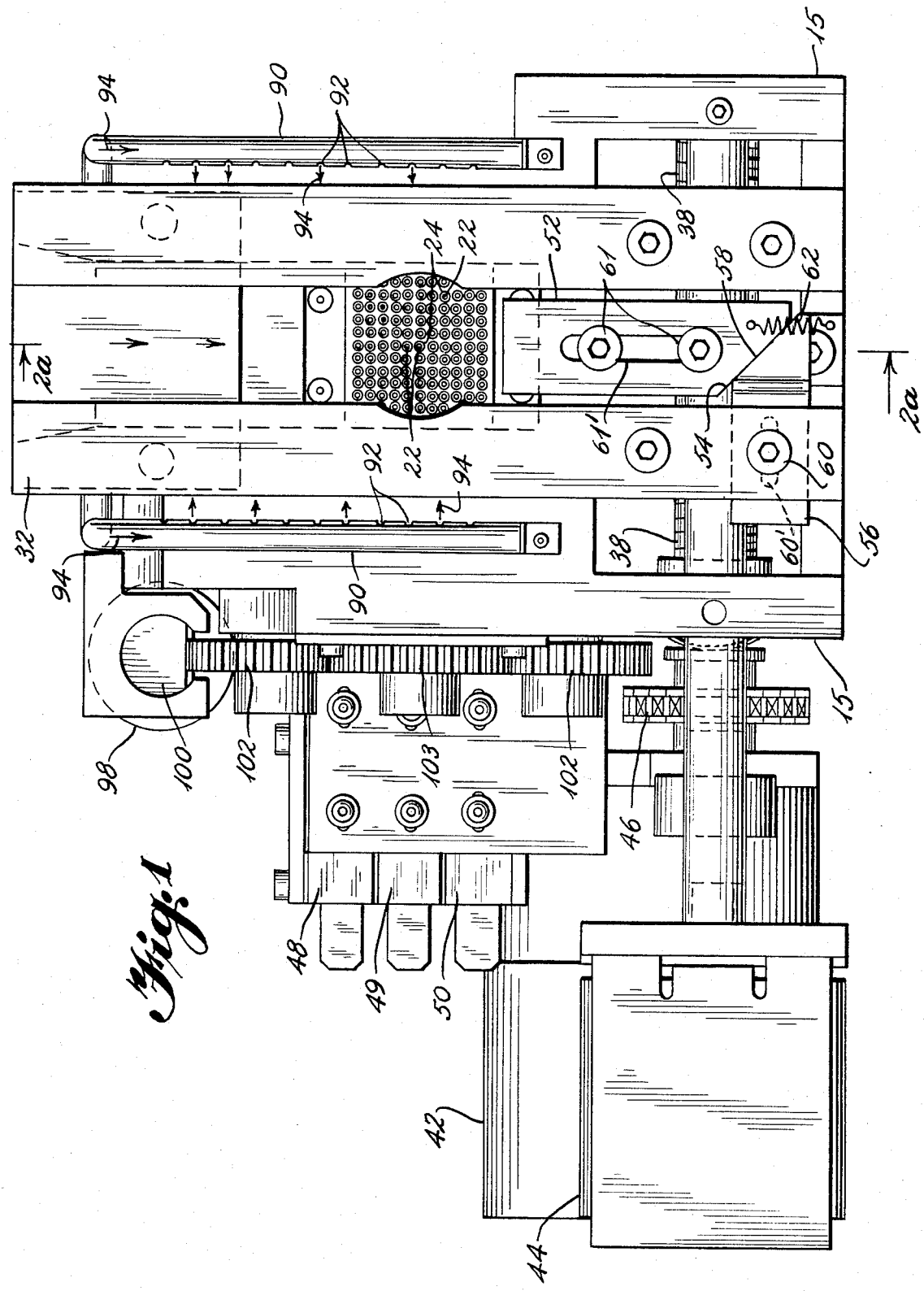
FIG. 1 is a front elevation of a preferred apparatus for gauging components.

Throughout the disclosure, reference is made to electronic components, two of which may be seen in FIGS. 10 and 11. In FIG. 10, a "square module" comprises a generally parallelepiped-shaped body 10 having leads 12, wherein the surface (bottom) of the body from which the leads project is generally a square surface. Angled portion 13 facilitates proper orientation of body 10. FIG. 11 discloses a variation of the component of FIG. 10 in which body 10' has leads 12' protruding from a surface which is generally rectangular in shape. A gauge block also is often referred to in the disclosure, and FIG. 9 illustrates a lead straightening portion 20 having lead straightening holes 22 and generally conical-shaped lead-in portions 24 for guiding the tips, of leads which are slightly off center from their intended axes into holes 22. The gauge block is made from an electrically nonconductive ceramic, plastic, or the like.

One embodiment of the instant invention is disclosed in FIGS. 1-5, to which the reader's attention is directed. Guide rails 32 are adjustable toward and away from each other in order to accomodate bodies 10 of different widths, such that the bodies 10 may slide along the guide rails 32, as by gravity. Air, as indicated by arrows 94 in FIG. 1, is supplied via tubes 90 and orfices 92 in order to press the component body 10 generally against guide rails 32 during feed thereof to a gauging station. This air flow insures that, with guide rails 32 adjusted toward or away from a gauge block 20 according to a thickness of body 10 and/or length of the leads 12, component 10 is properly held against and guided by guide rails 32 and does not flip or otherwise move to engage the leads 12 with an obstruction during such feeding and that leads 12 are clear of gauge block 20 prior to straightening thereof.

In order to properly position component 10 relative to gauge block 20, an adjustable feed stop is provided to engage body 10 of the component and arrest the feeding thereof. The adjustable feed stop comprises vertical portion 52 having cam surface 54 and horizontal portion 56 having cam portion 58. Horizontal portion 56 is attached to move with one of the guide rails 32, such that sliding engagement between cam surfaces 54 and 58 causes vertical portion 52 to move up and down (as viewed in FIG. 1), with constant engagement of cam surfaces 54 and 58 assured by tension spring 62. Vertical portion 52 has a slot 61' for sliding engagement with positioning screws 61, and initial vertical positioning of portion 52 is determined by horizontal adjustment and fixing of portion 56 on guide rail 32 as by machine screw 60 and adjustment slot 60'.

The presence or absence of component 10 at the gauging station is detected by a photo-sensor arrangement comprising transmitter 70 and receiver 72 (seen in FIG. 3), with guide rails 32 having slots 68 (FIGS. 2 and 2A) to allow a transmitted light beam to pass therethrough. Although slots 68 are illustrated as rather narrow and vertically oblong, it is contemplated that their width should always be sufficient to account for components having a reduced body thickness and modification to that end is contemplated.

Guide rails 32 have L-shaped support brackets 34 (best seen in FIGS. 2A and 4) slideable in the direction of axis 130, within grooves 37 of slides 35 which ride upon Thompson shafts 40. Slides 35 support guide rails 32 during lateral variation or adjustment of guide rails 32. Lateral adjustment of guide rails 32 is imparted by a lead screw 38 having a reverse pitch on the left and right ends thereof, with drive imparted thereto by motor 42 via a sprocket arrangement and timing chain 46. Encoder 44 allows exact drive of lead screw 38 in accordance with various widths of the component bodies 10.

After the component has been gauged, as explained hereinafter, guide rails 32 are backed-off from the gauge block 20 and spread apart so that they do not obstruct removal of the component from the gauge station. In order to sense the lateral spreading position of guide rails 32, a stack of micro switches 48, 49, 50 (best seen in FIG. 2) are provided. A bracket 47 is attached to one of the slide bearings 35 and supports a stack of cam plates 48', 49' and 50' (FIGS. 2 and 4) for actuation of micro switches 48-50. The angled camming surfaces of cam plates 48'-50' are best seen in FIG. 4, and are configured such that switches 48 and 50 are actuated if guide rails 32 are opened or spread apart too far, with switch 49 being made or actuated when guide rails 32 have reached the "home" position (to which they are spread upon completion of the gauging operation to facilitate removal of the component).

Figure 3:
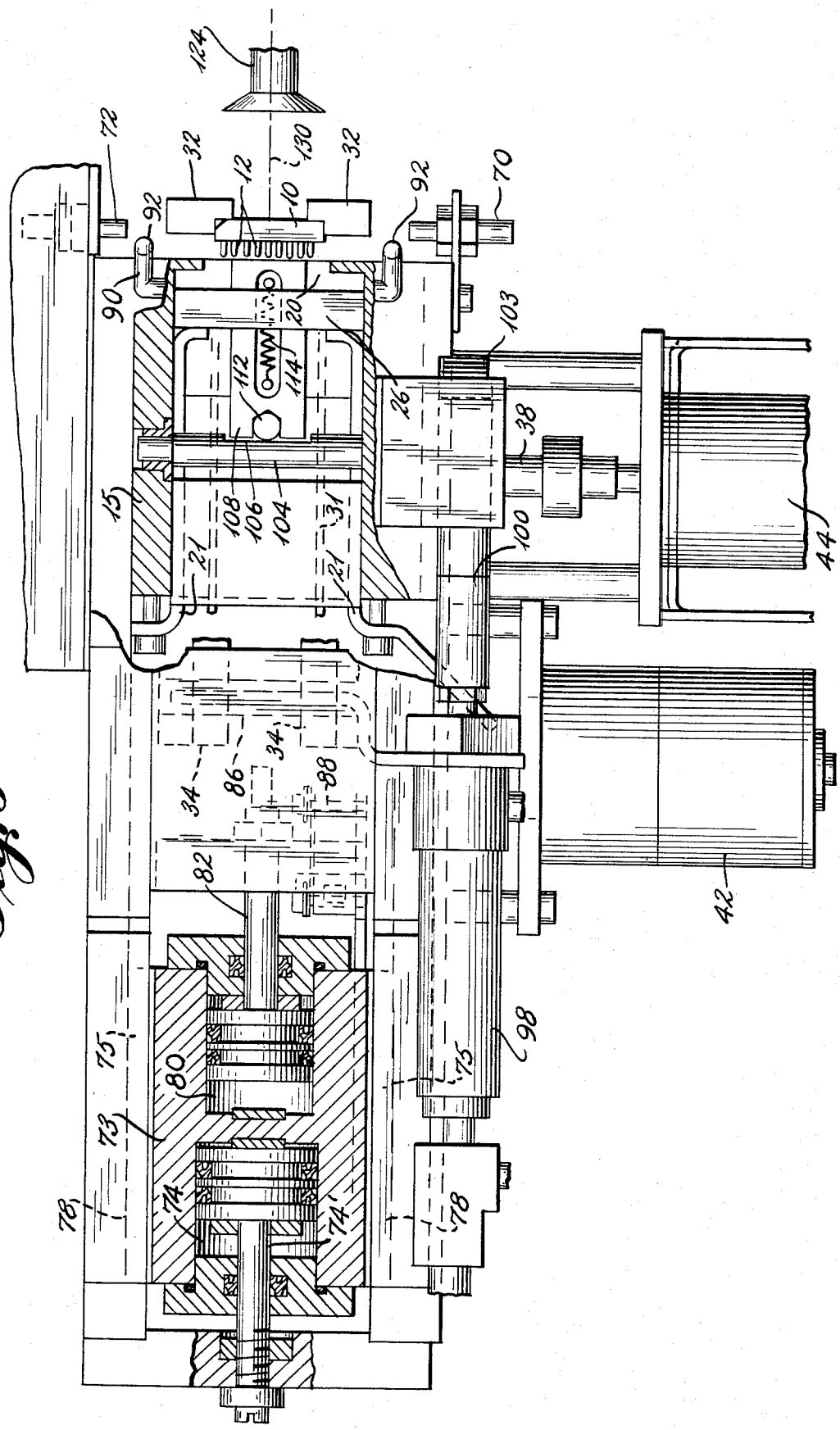
FIG. 3 is a cross-section, with parts broken away, as generally viewed in the direction of arrows 3—3 of FIG. 2.
Figure 4:
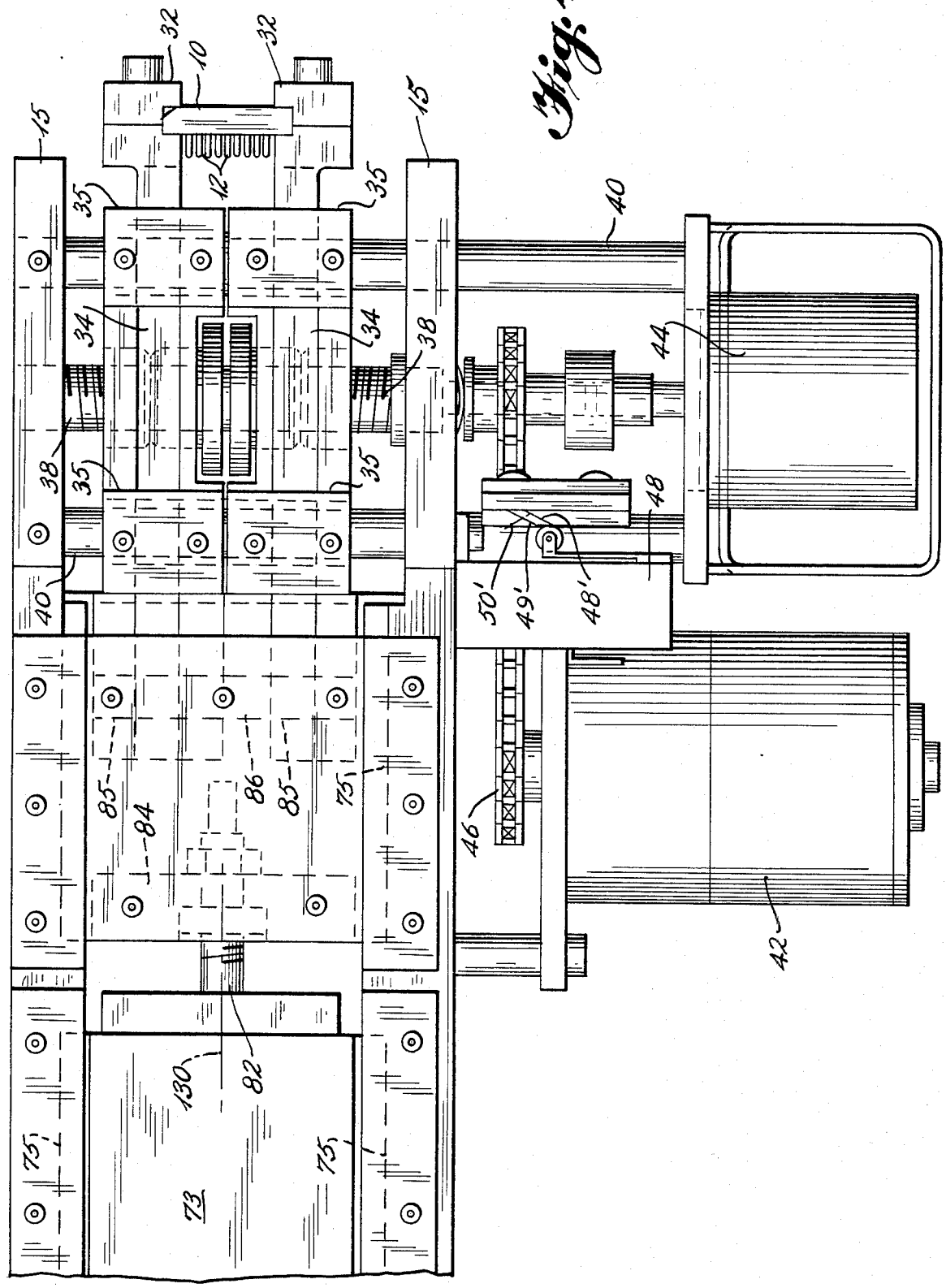
FIG. 4 is a cross-section, as generally viewed in the direction of arrows 4—4 of FIG. 2.

Guide rail support brackets 34 are further provided with slots 85 (as seen in FIG. 4) for reception of bar 86 along which they may slide during opening and closing thereof by lead screw arrangement 38. Bar 86 is attached to bracket 84 which, in turn, is attached to piston rod 82 of a gauge actuation cylinder 80. Actuation of cylinder 80, one-half of a double cylinder arrangement 73, causes extension and retraction of bracket 84 (guided in channels 75 which are best seen in FIG. 5) and the consequent retraction and extension of guide rails 32 in the direction of axis 130. Bracket 84 closes microswitch 88 (seen in FIG. 3) in the retracted position.

Figure 2:
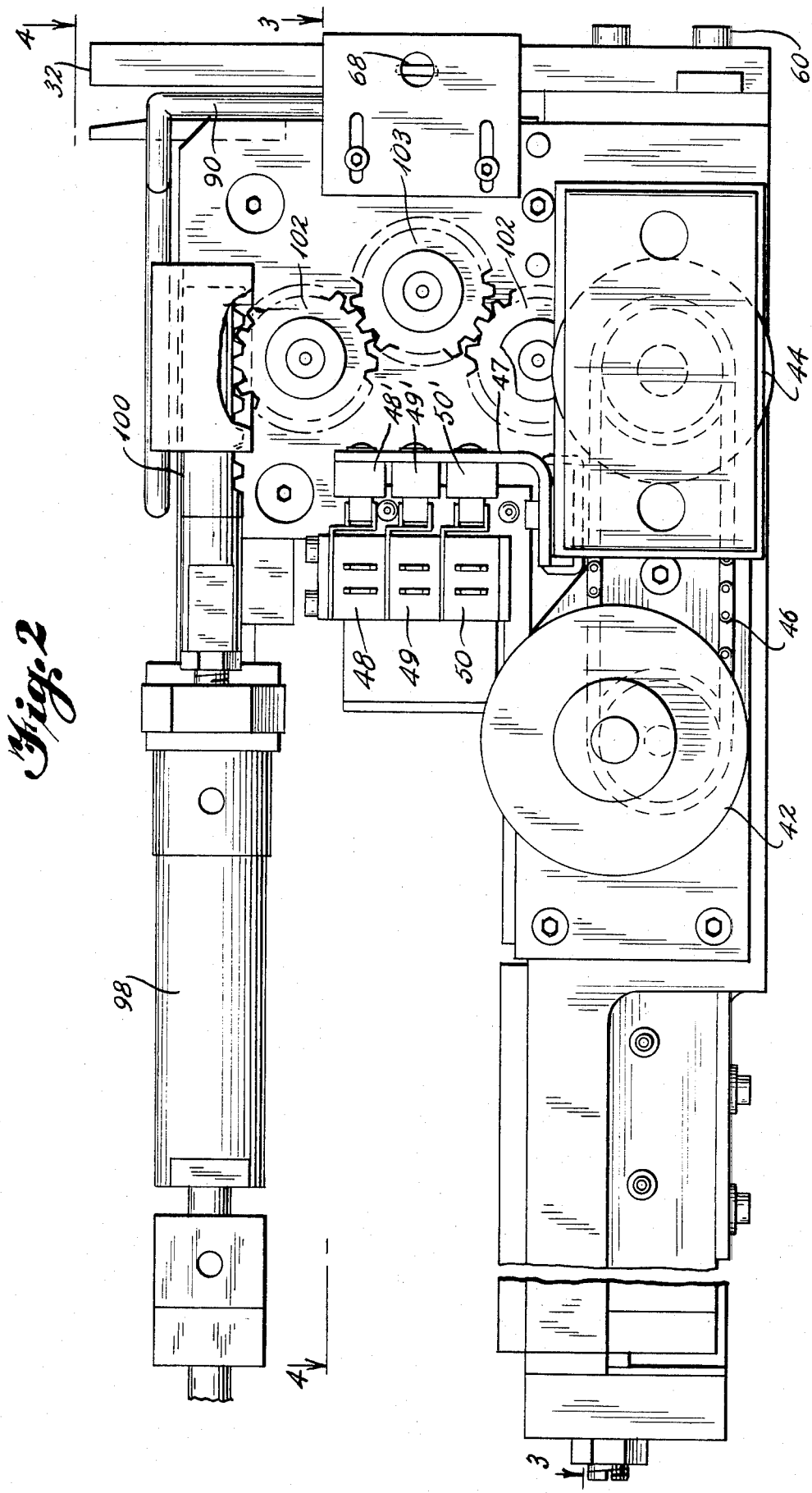
FIG. 2 is a left side elevation of the device of FIG. 1.

Referring to FIG. 3, brackets 21 are removably attached to fixed frame 15 and support a gauge block having lead straightening portion 20 and test portion 26 in a generally stationary position as seen in FIGS. 2A and 3. Lead straightening portion 20 is illustrated in FIG. 9 and, during retraction of guide rails 32 along axis 130, receives leads 12 of component 10.

In the preferred embodiment, lead straightener portion 20 is counter-bored at 30 (FIG. 9) for reception of portions of electrical contacts 28 which are housed in test portion 26 of the gauge. Although the familiar "pogo stick" type of spring loaded, telescoping electrical contacts are shown, it is contemplated that other forms of electrical contacts may be used. According to the lead diameters, it is often the case that the component is substantially supported by the friction of the leads 12 in the gauge block holes 22 and, accordingly, stripper bars 108 (FIG. 2A) are provided to remove the component from the gauging block for subsequent handling thereof. To this end, stripper bars 108 have end portions 110 for engaging the surface of component 10 from which leads 12 protrude. To facilitate the "stripping" action, the opposite ends of stripper bars 108 have balls 112 engaging the respective flats 106 of driver rods 104 (as best seen in FIGS. 2A and 3). Each of driver rods 104 has a spur gear 102 (FIG. 2) attached thereto with the upper gear 102 engageable with a rack gear 100 which is extensable and retractable by stripper cylinder 98. As may be seen in FIG. 2, gear 103 meshes with each of gears 102 to complete the drive train such that extension of rack gear 100 causes rotation of driver rods 104 and the extension of stripper bars 108. Return springs 114 (FIGS. 2A and 3) bias stripper rods 108 into engagement with driver rods 104 at all times.

Component 10 may vary in thickness and/or lead length, and provision is made for adjusting guide rods 32 backward and forward along axis 130 to account for such variation. Referring to FIGS. 3 and 5, thickness selection cylinder 74 comprises the back half of double cylinder 73. Piston rod 74' of thickness selection cylinder 74 is fixed to frame 78 by threaded adjustment such that, upon actuation of the cylinder, double cylinder body 73 slides along frame 78 and the ways 75 thereof and thus moves guide rods 32 towards or away from the gauge block 20 along axis 130.

Figure 6:
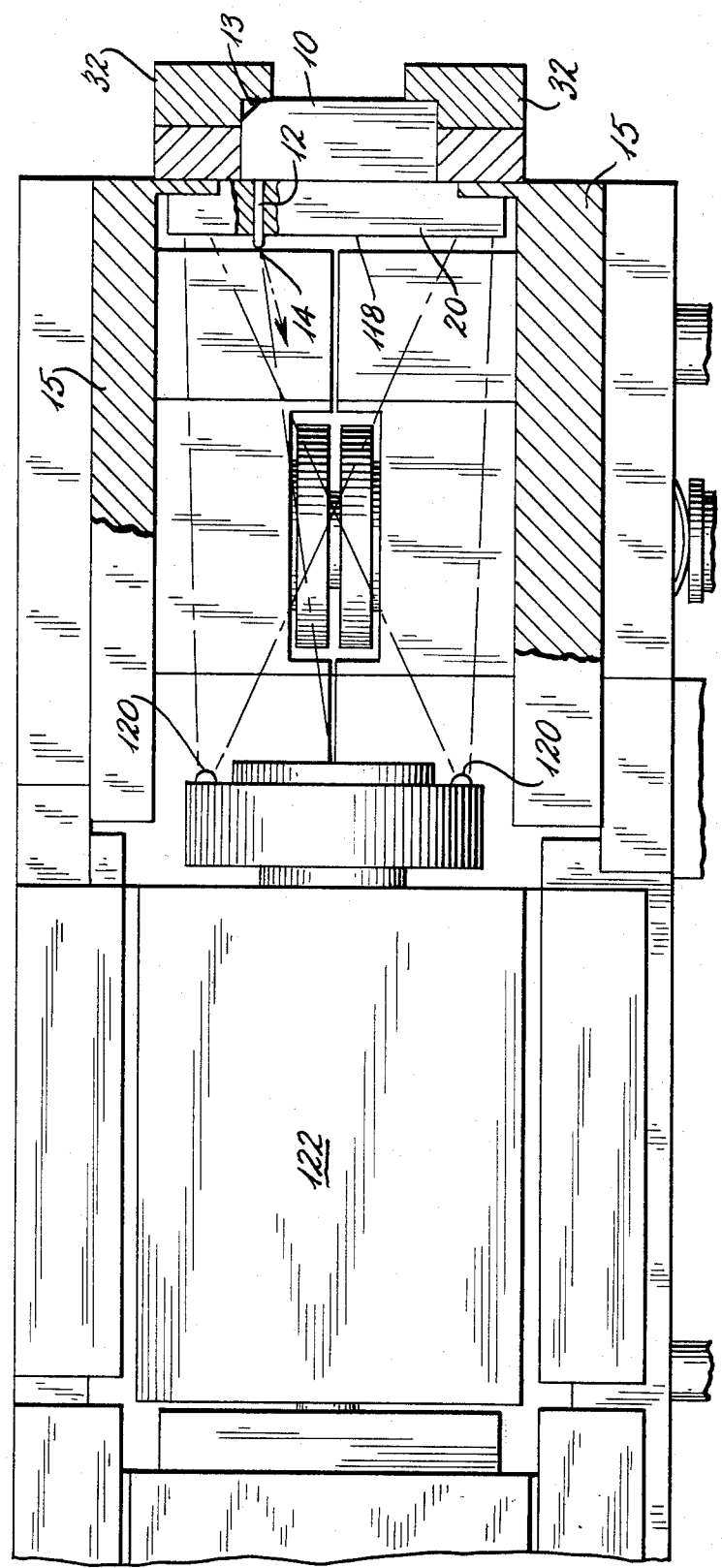
FIG. 6 is a schematic view, similar to FIG. 3, and illustrates an alternative embodiment of the invention.
Figure 7:
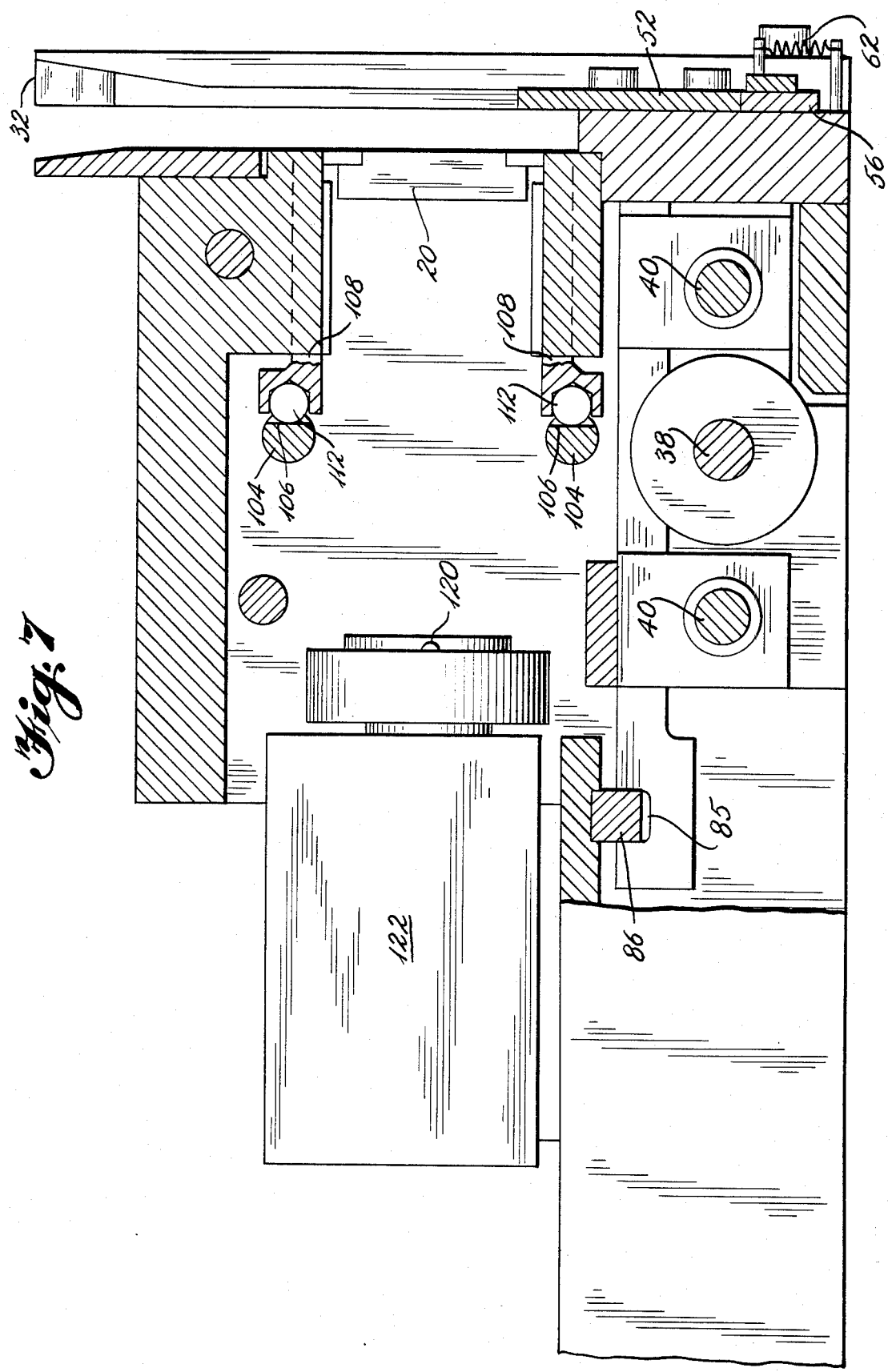
FIG. 7 is a schematic view, similar to FIG. 2, illustrating the alternative embodiment of FIG. 6.

An alternative gauging operation is schematically illustrated in FIGS. 6 and 7, in which test portion 26 of the gauging block has been removed such that, after the leads 12 have been straightened, tips 14 of acceptable leads will protrude from the back surface 118 of lead straightener 20. Back surface 118 may be darkened, as with a matte black paint, such that illumination of the black surface by a light source 120 will contrast the tips 14 of leads 12 against this darkened surface 118 and allow scanning thereof by a camera 122. Accordingly, acceptable lengths and patterns of leads 12 may be easily detected and compared to a nominal arrangement or pattern of leads that should be present.

Figure 8A:
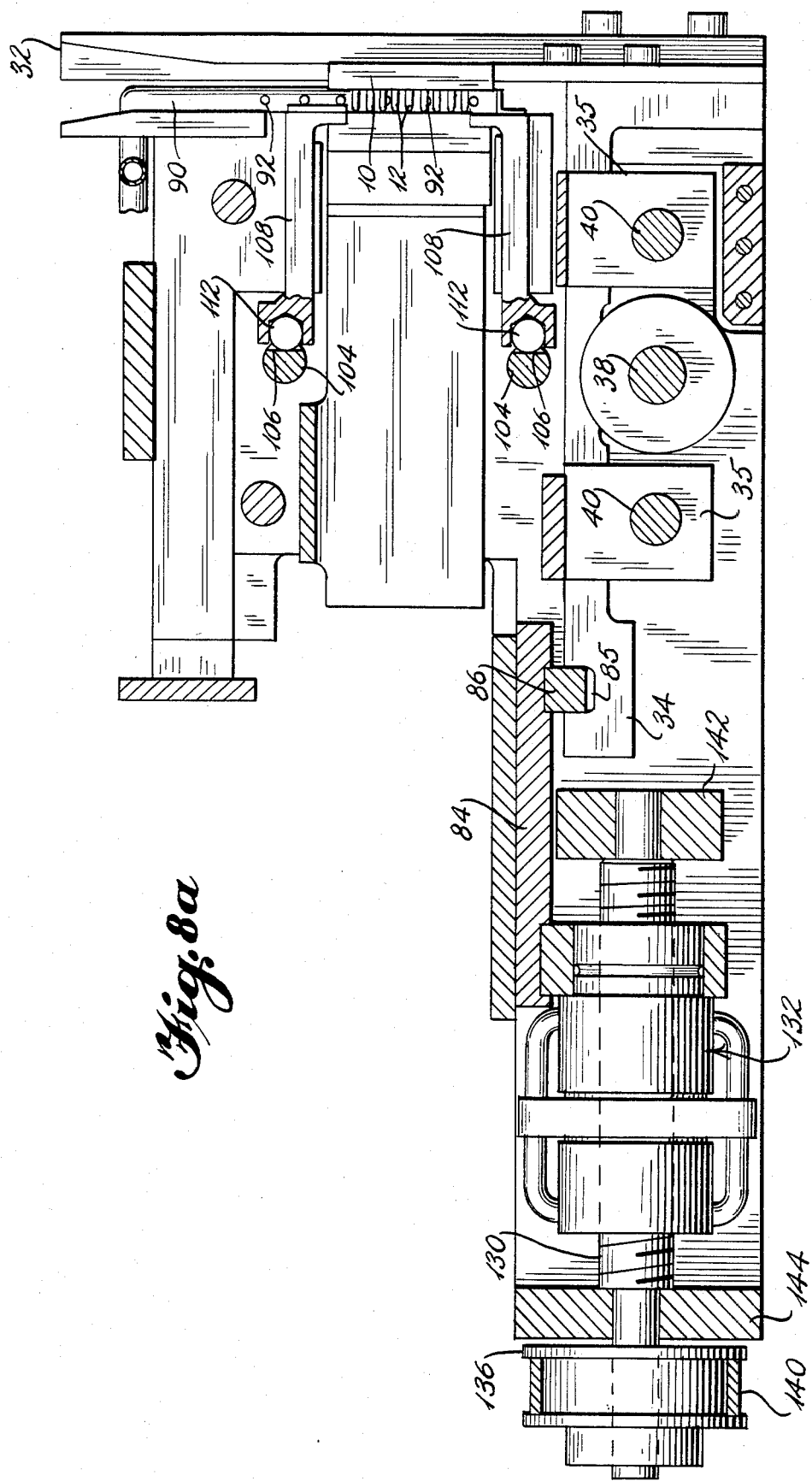
FIG. 8A is a cross-section, similar to that of FIG. 2A, to illustrate the embodiment of FIG. 8.

FIGS. 8 and 8A disclose an alternative thickness selection and gauging actuation assembly which may replace double cylinder 73 in order that a greater range of variation may be accomodated for the thickness selection and gauging movement. Lead screw 130 is mounted for rotation in brackets 142 and 144, which are appropriately affixed to frame 15. Ball nut 132 is attached to bracket 84 (in much the same manner as the embodiment of FIG. 2A) such that movement of ball nut 132 back-and-forth by actuation of lead screw 130 provides for the thickness selection and gauging actuation. Lead screw 130 is driveable by motor 134 (FIG. 8) via pulleys 136 and 138 and timing belt 140.

In operation, guide rails 32 are moved toward or away from each other by actuation of lead screw 38, and toward or away from the gauging station by thickness select cylinder 74 (or lead screw 130 in FIG. 8) in order to accomodate the dimensions of body 10 and leads 12 of a component. Having made this initial adjustment, components 10 are sequentially fed along guide rods 32 to the gauging station, at which time gauge actuation cylinder 80 (or lead screw 130 of FIG. 8) is actuated to drive the component leads 12 into lead straightener block 20 for straightening and testing purposes. Upon completion of the gauging, insert head 124 (as seen in FIG. 3) grips the component by vacuum or the like, whereupon the gauge actuation means is extended and the lead screw 38 opens guide rods 32 for removal of the component from the gauging station. In order that such removal is facilitated, stripper cylinder 98 is extended in concert with retraction of insert head 124.

It will thus be seen that the objects set forth above, among those made apparent from the preceeding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described, what is claimed as new and desired to be secured by Letters Patent is:

1. A method of handling electrical components of the type having a body and multiple rows of leads protruding out through one surface of said body with each of said leads defineable by a longitudinal axis intended to be substantially perpendicular to said one surface; said method comprising the steps for each component of:
    straightening each lead of said component which is bent from said axis along at least a portion of a length thereof in order to facilitate subsequent handling of said component;
    testing electrical functioning of said component, during said straightening, in order to determine said subsequent handling; and
    controlling said handling of electrical components according to an automated controller in order to effect said straightening and testing.

2. A method as in claim 1, wherein said bodies vary in size, and further comprising the steps for each component of:
    controlling an orientation of said body;
    feeding and guiding said component to a guage station for said straightening and testing; and
    controlling said feeding and guiding according to a size of said body.

3. A method as in claim 2, wherein said body has a thickness in a direction generally parallel to said lead axis, and further comprising the step of:
    adjusting said guiding according to said thickness.

4. A method as in claim 2, wherein said body has a width and a length generally perpendicular to said lead axis and to each other and further comprising the step of:
    adjusting said feeding according to said length.

5. A method as in claim 2, wherein said body has a width and a length generally perpendicular to said lead axis and to each other, and further comprising the step of:
    adjusting said guiding according to said width.

6. A method as in claim 2, wherein said leads vary in length from component to component, and further comprising the step for each component of:
    adjusting said guiding according to said lead length.

7. A method as in claim 1, and further comprising the step of:
    guiding and engaging said leads into holes of a gauge during said straightening and testing.

8. A method as in claim 3, wherein a gauge is located generally at said gauge station, and further comprising the step of:
    providing clearance between said gauge and said component during said feeding to said gauge station.

9. A method of handling components of the type having a body and leads projecting out through one surface of said body with each of said leads defineable by a longitudinal axis, said method comprising the steps for each component of:
    straightening leads which are bent from their respective axes along at least a portion of their length;
    distinguishing between good and bad leads, wherein said bad leads comprise, after said straightening, the set of missing leads, bent leads, and short leads, said short leads being leads which are shorter than a specified length for a particular component; and
    controlling said handling of electrical components according to an automated controller in order to effect said straightening and testing.

10. A method as in claim 9, wherein said distinguishing comprises the step of:
    sensing a reflection of light from said good leads after said straightening.

11. A method in claim 9, and further comprising the step of:
    scanning at least a portion of said good leads to facilitate said distinguishing.

12. An apparatus for handling electrical components of the type having a body and multiple rows of leads protruding through one surface of said body with each of said leads defineable by a longitudinal axis intended to be substantially perpendicular to said one surface, said apparatus comprising:

means for straightening leads which are bent from their respective axis along at least a portion of their lengths in order to facilitate subsequent handling of said component;

means for testing electrical functioning of each of said components, generally during said straightening, in order to determine said subsequent handling; and means for controlling said apparatus automatedly in order to effect said straightening and testing.

13. An apparatus as in claim 12, wherein said bodies vary in size, and further comprising:

means for controlling an orientation of said body;

means for feeding and guiding each component to a gauge station for said straightening and testing; and means for controlling said feeding and guiding according to a size of said body.

14. An apparatus as in claim 13, wherein said body has a thickness in a direction generally parallel to said lead axis, and further comprising:

means for adjusting said guiding according to said thickness.

15. An apparatus as in claim 13, wherein said body has a width and a length generally perpendicular to said lead axis, and to each other, and further comprising:

means for adjusting said feeding according to said length.

16. An apparatus as in claim 13, wherein said body has a width and a length generally perpendicular to said lead axis and to each other, and further comprising:

means for adjusting said guiding according to said width.

17. An apparatus as in claim 13, wherein said leads very in length from component, and further comprising:

means for adjusting said guiding according to said lead length.

18. An apparatus as in claim 12, and further comprising:

means for guiding and engaging said leads into holes of a gauge during said straightening and testing.

19. An apparatus as in claim 13, and further comprising:

means for transferring said component from said gauge station to another station after said straightening and testing.

20. An apparatus as in claim 13, wherein a gauge is located generally at said gauge station, and further comprising:

means for providing clearance between said gauge and said component during said feeding to said gauge station.

21. An apparatus for handling components of the type having a body and leads projecting through one surface of said body with each of said leads defineable by a longitudinal axis, said apparatus comprising:

means for straightening leads which are bent from their respective axes along at least a portion of their lengths;

means for distinguishing between good and bad leads, wherein said bad leads comprise, after said straightening, the set of missing leads, bent leads, and short leads, said short leads being leads which are shorter than a specified length for a particular component; and means for controlling said apparatus automatedly in order to effect said straightening and testing.

22. An apparatus as in claim 21, wherein said distinguishing means comprises:

means for sensing a reflection of light from said good leads after said straightening.

23. An apparatus in claim 21, and further comprising:

means for scanning at least a portion of said good leads to facilitate said distinguishing.

24. An apparatus as in claim 18, and further comprising:

a gauge block having said holes, said guiding means comprising generally conical-shaped lead-ins for guiding said leads into said holes during said straightening.

25. An apparatus as in claim 13, and further comprising:

a gauge block for receiving said leads during said straightening and testing; and means for disengaging said leads from said gauge block after said testing.

26. An apparatus as in claim 24, and further comprising:

means for capturing said component and removing said component from said gauge station.

27. An apparatus as in claim 26, said capturing means comprising:

means for positively engaging said body and inserting said component leads into corresponding holes of a circuit board.

28. An apparatus as in claim 26, wherein said capturing means comprises:

stripper blades for engaging said one surface of said body and a vacuum means for engaging another surface of said body, said vacuum means providing support for said component during subsequent mounting thereof on a circuit board.

29. An apparatus as in claim 20, wherein said clearance providing means comprises:

fluid pressure means for insuring that said body follows said feeding and guiding means and for insuring that said leads clear said gauge prior to said straightening.

30. An apparatus as in claim 14, and further comprising:

guide rails along which said component is fed to said gauge station, said guide rails being variable such that bodies of different dimensions are accommodatable.

31. An apparatus as in claim 30, and further comprising:

stop means along a feed path for said component, said stop means being variable such that bodies of different dimensions are positionable relative to said gauge station according to said dimensions.

32. An apparatus as in claim 31, and further comprising:

means for moving said guide rails toward and away from a gauge block at said gauge station such that different component thicknesses are accommodatable.

33. An apparatus as in claim 32, and further comprising:

means for applying air to said bodies along said feed path such that said bodies are caused to travel generally in engagement with said guide rails.

* * * * *